United States Patent
Kumano

(10) Patent No.: US 8,809,094 B2
(45) Date of Patent: Aug. 19, 2014

(54) METHOD OF MANUFACTURING SOLID-STATE IMAGE SENSOR

(75) Inventor: Hideomi Kumano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 13/477,665

(22) Filed: May 22, 2012

(65) Prior Publication Data

US 2012/0322196 A1 Dec. 20, 2012

(30) Foreign Application Priority Data

Jun. 15, 2011 (JP) ................. 2011-133539

(51) Int. Cl.
*H01L 21/00* (2006.01)
*H01L 27/146* (2006.01)

(52) U.S. Cl.
CPC .... *H01L 27/14627* (2013.01); *H01L 27/14629* (2013.01)
USPC .............................. 438/48; 438/72

(58) Field of Classification Search
CPC .................. H01L 27/14627; H01L 27/14629
USPC ..................................... 438/48, 72
See application file for complete search history.

(56) References Cited

U.S. PATENT DOCUMENTS 7,087,945 B2 * 8/2006 Nakai et al. ............... 257/294
7,442,973 B2 * 10/2008 Komoguchi et al. ......... 257/291
7,842,986 B2 11/2010 Komoguchi et al.

FOREIGN PATENT DOCUMENTS

| JP | 5-235313 A | 9/1993 |
|---|---|---|
| JP | 2004-193500 A | 7/2004 |
| JP | 2007-305690 A | 11/2007 |
| JP | 2008-091771 A | 4/2008 |

OTHER PUBLICATIONS

Takanori Tanaka et al., "Stress-Enhancement in Free-Standing Si Pillars Through Nonequilibrium Dehydrogenation in SiN:H Stress-Liners by Ultraviolet Light Irradiation," 33 Appl. Phys. Lett. 16-19 (Dec. 2009).
Hsiao-Wen Zan et al.,"Low Temperature Annealing with Solid-State Laser or UV Lamp Irradiation on Amorphous IGZO Thin-Film Transistors," 13(5) Electrochem. Solid-State Lett. H144-H146 (Mar. 2010).
W. L. Warren et al., "Ultraviolet Light Induced Annihilation of Silicon Dangling Bonds in Hydrogenated Amorphous Silicon Nitride Films," 77 (11) J. Appl. Phys. 5730-5735 (Jun. 1995).
A. Markwitz et al., "Change of Surface Structure of Thin Silicon Nitride Layers During Electron Beam Rapid Thermal Annealing," 64(20) Appl. Phys. Lett. 2652-2654 (May 1994).

* cited by examiner

*Primary Examiner* — Luan C Thai
(74) *Attorney, Agent, or Firm* — Fitzpatrick, Cella, Harper & Scinto

(57) ABSTRACT

A method of manufacturing a solid-state image sensor, comprising preparing a semiconductor substrate including a photoelectric converter and an insulating film which includes an opening and is formed in a region above the photoelectric converter, depositing a material having a refractive index higher than the insulating film in the opening, and annealing the material deposited in the opening by irradiating the material with one of light and radiation, wherein a light waveguide which is configured to guide an incident light to the photoelectric converter is formed through the depositing and the annealing.

8 Claims, 9 Drawing Sheets

US 8,809,094 B2

METHOD OF MANUFACTURING SOLID-STATE IMAGE SENSOR

BACKGROUND OF THE INVENTION

1. Field of the Invention

The present invention relates to a method of manufacturing a solid-state image sensor.

2. Description of the Related Art

There is known a technique of improving the light condensing performance by forming a light waveguide made of a high refractive index material in a region on a photoelectric converter such as a photodiode which forms a pixel so that light is totally reflected by the interface of the light waveguide (see Japanese Patent Laid-Open Nos. 05-235313 and 2004-193500). A typical example of the material of this light waveguide is silicon nitride deposited using the high density plasma CVD (Chemical Vapor Deposition) method.

The use of silicon nitride as the material of a light waveguide poses a problem associated with heat stress resulting from the difference in thermal expansion coefficient between the nitride silicon and an insulating film which surrounds it. When an opening is formed in an insulating film on a photoelectric converter and filled with silicon nitride so as to form a light waveguide, a process defect may be generated by heat stress acting between the silicon nitride and the insulating film. Examples of this process defect include an increase in manufacturing variation due to warping of a silicon wafer, the occurrence of a crack in the insulating film, or an increase in leakage current of a chip.

SUMMARY OF THE INVENTION

The present invention provides a technique advantageous in reducing heat stress acting between an insulating film and the material of a light waveguide to solve the above-mentioned problems and thereby improve the quality/reliability of a solid-state image sensor.

One of the aspects of the present invention provides a method of manufacturing a solid-state image sensor, comprising preparing a semiconductor substrate including a photoelectric converter and an insulating film which includes an opening and is formed in a region above the photoelectric converter, depositing a material having a refractive index higher than the insulating film in the opening, and annealing the material deposited in the opening by irradiating the material with one of light and radiation, wherein a light waveguide which is configured to guide an incident light to the photoelectric converter is formed through the depositing and the annealing.

Further features of the present invention will become apparent from the following description of exemplary embodiments with reference to the attached drawings.

DESCRIPTION OF THE EMBODIMENTS

Figure 1:
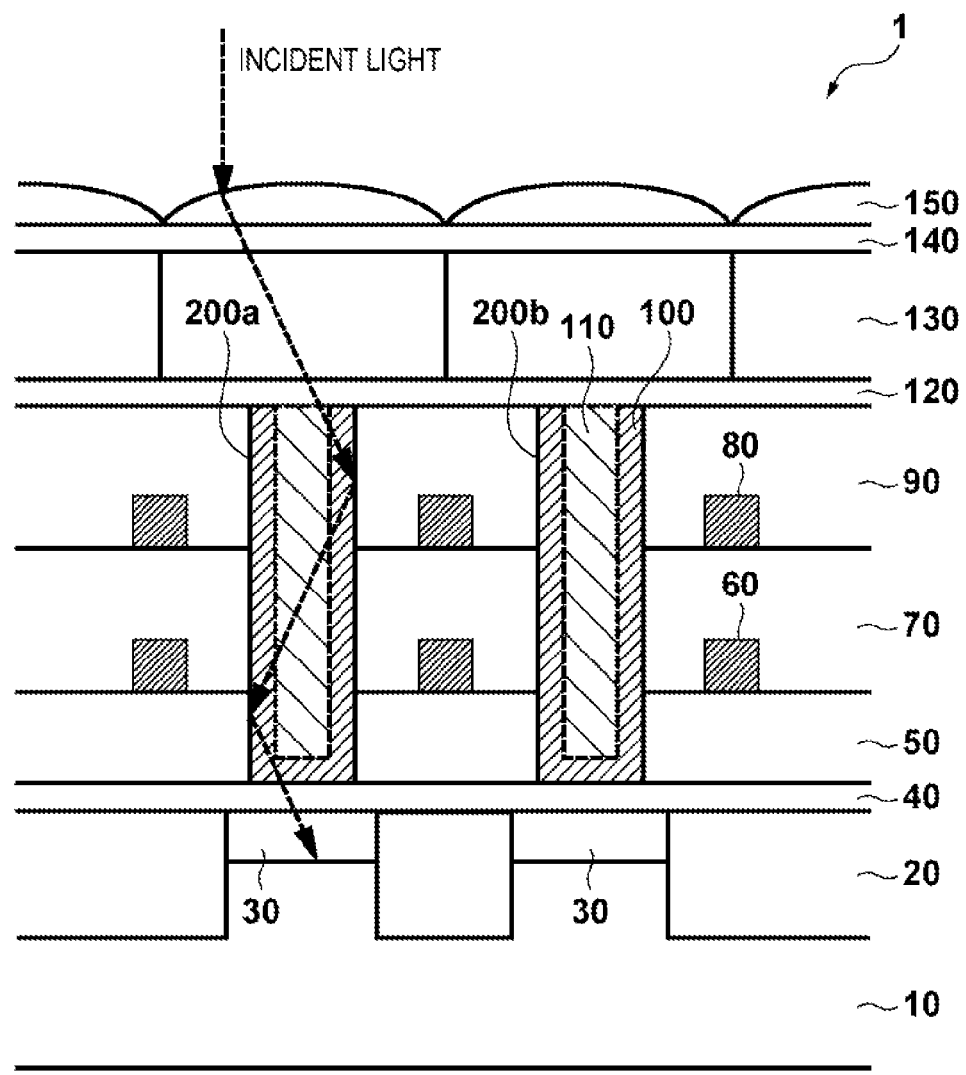
FIG. 1 is a sectional view illustrating an example of the configuration of a solid-state image sensor.

A solid-state image sensor according to an embodiment of the present invention will be described with reference to FIG. 1. The solid-state image sensor can be configured as, for example, a CMOS image sensor or a CCD image sensor. In a solid-state image sensor 1, a plurality of photoelectric converters 30 can be arranged in a semiconductor substrate 10. Element isolation regions 20 can be arranged between the photoelectric converters 30. An insulating layer 40 can be arranged on the photoelectric converters 30 and element isolation regions 20. Note that a transfer transistor for charge transfer and an amplifier transistor (neither is shown) may be arranged near each photoelectric converter 30. Also, the insulating layer 40 may be arranged on these transistors. The insulating layer 40 can function as an etching stop. A first insulating film 50 can be arranged on the insulating layer 40. Further, a first metal interconnection layer 60 and a second insulating film 70 can be arranged on the first insulating film 50, and a second metal interconnection layer 80 and a protective layer 90 can be arranged on the second insulating film 70. Regions defined by the first insulating film 50, second insulating film 70, and protective layer 90 include openings 190 (see FIG. 3) extending from the surface of the protective layer 90 to the upper surface of the insulating layer 40. This makes it possible to prepare a semiconductor substrate including an insulating film which includes the openings 190 and is formed in the region above the photoelectric converters 30. The openings 190 can be filled with a material having a refractive index higher than the first insulating film 50, second insulating film 70, and protective layer 90 to form light waveguides 200 (denoted by different reference numerals 200a and 200b in FIG. 1). Further, a first planarizing layer 120, a color filter layer 130, and a second planarizing layer 140 can be arranged on the protective layer 90 and light waveguides 200, and microlenses 150 can be arranged on the second planarizing layer 140. Note that each opening 190 may be an opening obtained by completely removing the first and second insulating films, or a so-called recess having the first or second insulating film which forms its bottom.

Light incident on the microlens 150 is refracted by it and guided to the light waveguide 200. As described earlier, because the light waveguide 200 is formed by a material having a refractive index higher than the first insulating film 50, second insulating film 70, and protective layer 90, light having a large incident angle can be totally reflected by the interface of the light waveguide 200 and guided to the photoelectric converters 30. Note that the light waveguide 200 is obtained by irradiating its material with light or radiation to anneal it. The light waveguide 200 can have a concentric structure formed by one columnar part and at least one cylindrical part which surrounds it. As an example, FIG. 1 illustrates a concentric structure formed by one columnar part (high refractive index material 110) and one cylindrical part (high refractive index material 100) which surrounds it. However, the materials which form the light waveguide 200 may be the same. The use of the same material as the materials which form the light waveguide 200 makes their refractive indices equal or nearly equal to each other. This makes it possible to prevent light incident on the gaps between these materials and, in turn, to condense light with less loss.

Note that the first metal interconnection layer 60 and second metal interconnection layer 80 can also be used to transmit electrical signals from the photoelectric converters 30. The first metal interconnection layer 60 and second metal interconnection layer 80 can also be used to prevent light leaked from each light waveguide such as the light waveguide 200a from entering the other light waveguide such as the light waveguide 200b. Alternatively, the first metal interconnection layer 60 and second metal interconnection layer 80 can also be used to prevent light incident on the gaps between the light waveguides from entering the photoelectric converters 30.

A method of manufacturing a solid-state image sensor 1 according to an embodiment of the present invention will be described below with reference to the accompanying drawings. This method will be described with reference to FIG. 2 first. A p-type semiconductor substrate 10 such as a silicon wafer is prepared, and element isolation regions 20 such as STI (Shallow Trench Isolation) are formed in the p-type semiconductor substrate 10. As photoelectric converters 30, photodiodes, for example, are formed by implanting n-type impurity ions and annealing them. At this time, a natural oxide film may be formed on the surfaces of the photoelectric converters 30, or a gate insulating film may be formed on the surfaces of the photoelectric converters 30 if MOS transistors are present near the photoelectric converters 30. The thickness of the natural oxide film or gate insulating film is sufficiently smaller than the wavelength of incident light, and therefore does not influence light reflection.

An insulating layer 40 is formed on the photoelectric converters 30 and element isolation regions 20 by, for example, the CVD (Chemical Vapor Deposition) method. The insulating layer 40 is desirably etched at a rate lower than that at which a first insulating film 50 and a second insulating film 70 (both will be described later) are etched. This allows the insulating layer 40 to serve as an etching stopper which stops the progress of etching in forming openings 190 to serve as light waveguides 200 (to be described later) by etching. Note that the insulating layer 40 is made of, for example, silicon nitride.

A first insulating film 50 is formed on the insulating layer 40 by, for example, the CVD method. Note that the patterning accuracy of a first metal interconnection layer 60 arranged on the first insulating film 50 can be improved by planarizing the first insulating film 50 by, for example, the CMP (Chemical mechanical polishing) method. The first insulating film 50 is made of, for example, silicon oxide and functions as an interlayer insulating film.

A first metal interconnection layer 60 is formed on the first insulating film 50 by, for example, the sputtering method. This layer can be formed by, for example, Al, Mo, W, Ta, Ti, or Cu. A region other than the first metal interconnection layer 60 is selectively etched by, for example, photolithography and etching steps to form the first metal interconnection layer 60. Note that the first metal interconnection layer 60 may be formed in the trenches of the first insulating film 50 by the damascene or dual damascene method.

A second insulating film 70 is formed on the first insulating film 50 and first metal interconnection layer 60 by, for example, the CVD method. Note that the second insulating film 70 can also be planarized by, for example, the CMP method. The second insulating film 70 is made of, for example, silicon oxide and functions as an interlayer insulating film.

A second metal interconnection layer 80 is formed on the second insulating film 70 by, for example, the sputtering method. This layer can be formed by, for example, Al, Mo, W, Ta, Ti, or Cu. A region other than the second metal interconnection layer 80 is selectively etched by, for example, photolithography and etching steps to form the second metal interconnection layer 80. The second metal interconnection layer 80 can also be formed using other methods, like the first metal interconnection layer 60.

Figure 2:
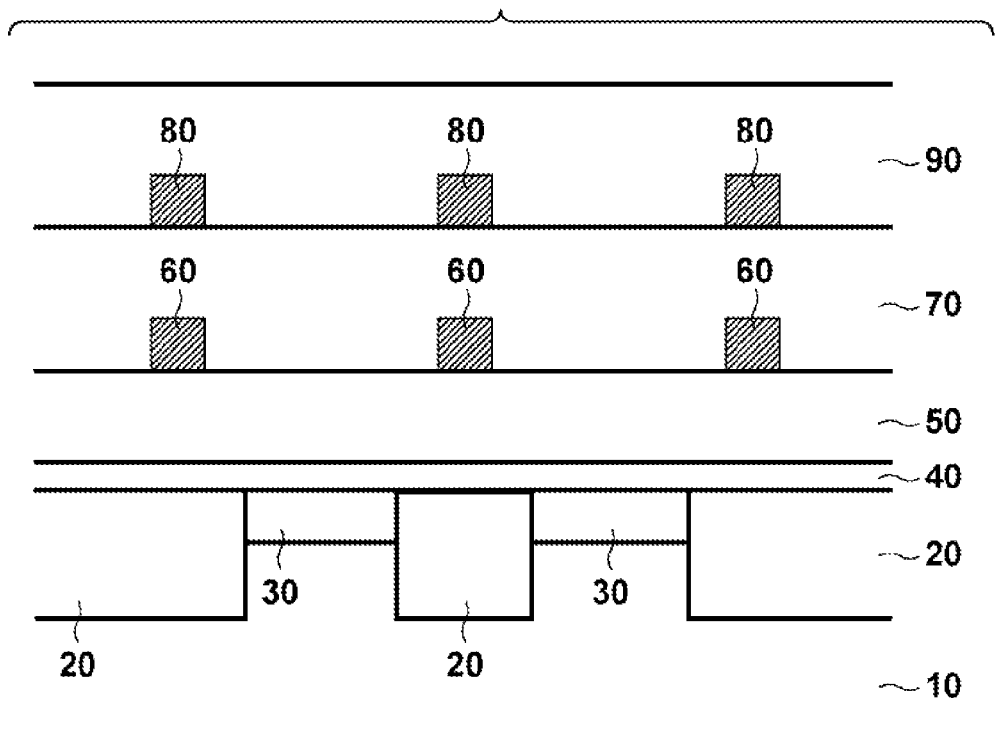
FIG. 2 is a sectional view for explaining a step in manufacturing a solid-state image sensor according to an embodiment of the present invention.

A protective layer 90 is formed on the second insulating film 70 and second metal interconnection layer 80 by, for example, the plasma CVD method. The protective layer 90 is formed by an insulating material such as silicon nitride, silicon oxynitride, or silicon oxide. Note that as the material of at least the first insulating film 50 and second insulating film 70, an insulating material having a refractive index lower than the materials which form light waveguides 200 need only be selected. As a result, a state shown in a sectional view of FIG. 2 is obtained.

Figure 3:
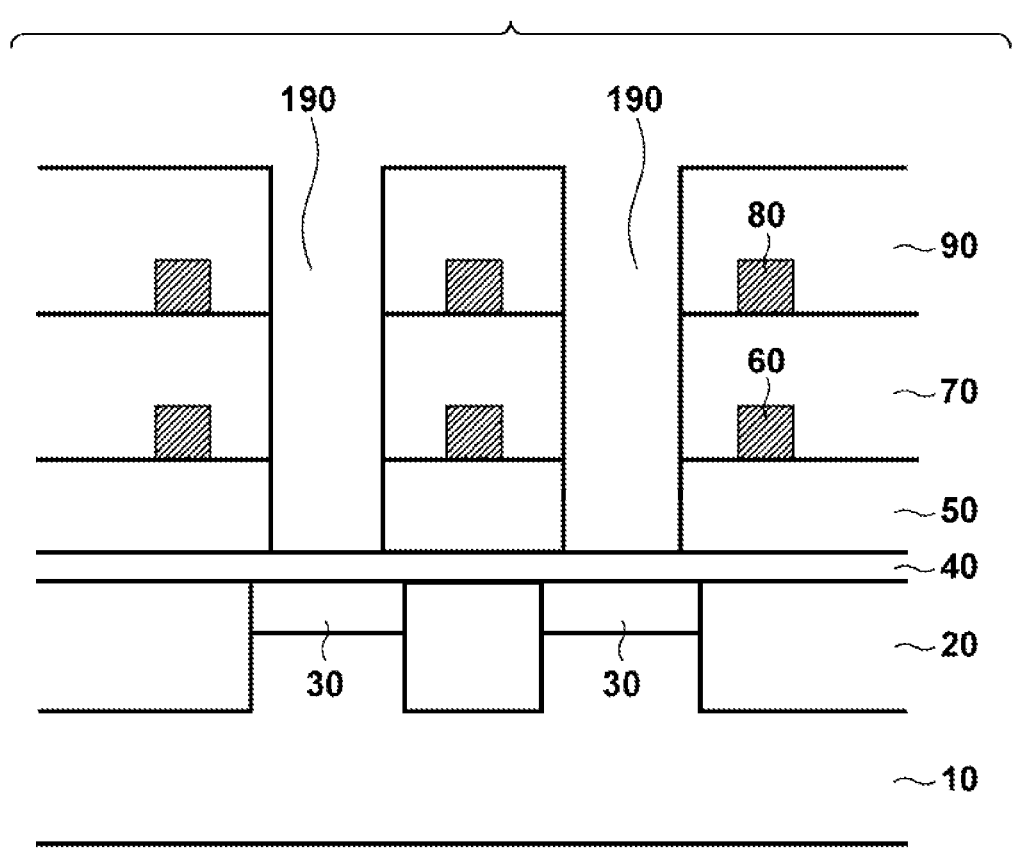
FIG. 3 is a sectional view for explaining a step in manufacturing a solid-state image sensor according to the embodiment of the present invention.

Openings 190 to serve as light waveguides 200 are formed to extend from the surface of the protective layer 90 to the upper surface of the insulating layer 40 by, for example, photolithography and dry etching steps, so a state shown in a sectional view of FIG. 3 is obtained. Note that the rate of etching decreases in, for example, the insulating layer 40, so this decrease in rate can be detected to end the etching. The end of etching can also be determined by other methods. Also, this etching step is preferably performed under etching conditions optimum for removal of each interlayer insulating film.

Figure 4:
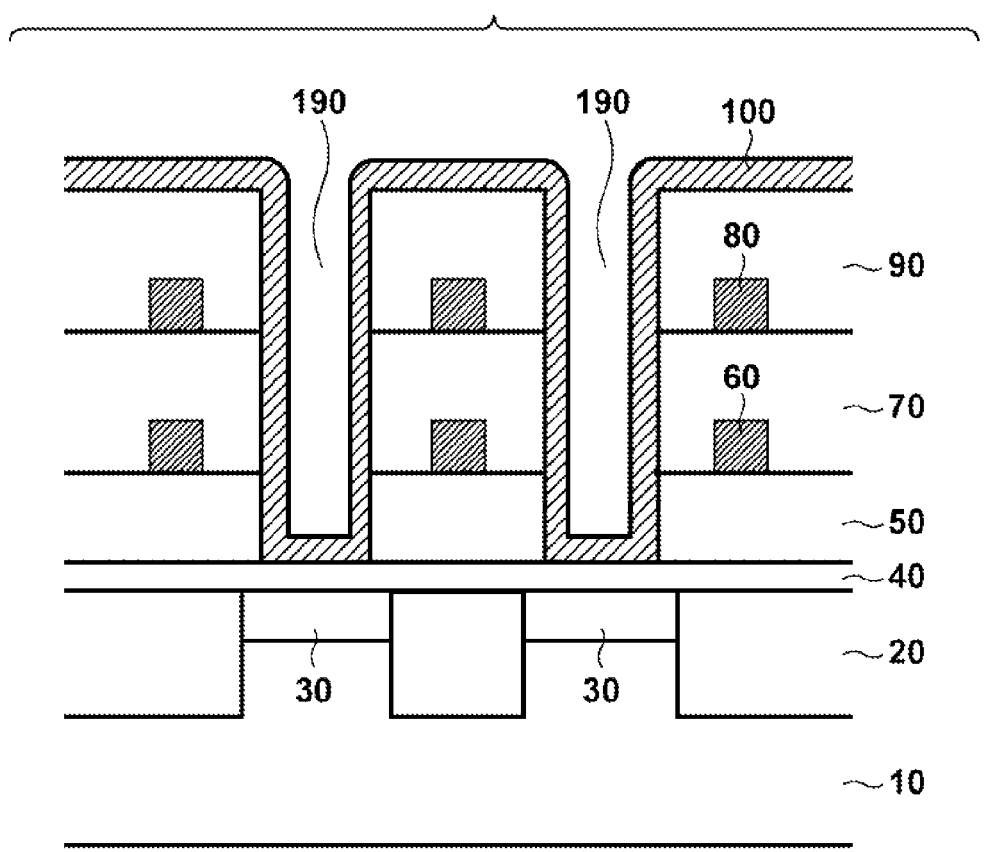
FIG. 4 is a sectional view for explaining a step in manufacturing a solid-state image sensor according to the embodiment of the present invention.

A high refractive index material 100 is deposited in the openings 190 by, for example, the HDP (High Density Plasma)-CVD method. The high refractive index material 100 is, for example, silicon nitride or silicon oxynitride and has a refractive index higher than the first insulating film 50, second insulating film 70, and protective layer 90. The case wherein each opening 190 has a diameter of 1 μm and a depth of 3.5 μm will be considered herein. The high refractive index material 100 is deposited in the openings 190 at a thickness of about 1 μm by the HDP-CVD method. An anneal step is performed on the high refractive index material 100 by irradiating it with light (for example, UV (Ultraviolet) light) or radiation (for example, an EB (Electron Beam)). As a result, a state shown in a sectional view of FIG. 4 is obtained. This anneal step can be done under the condition in which the high refractive index material 100 has a temperature that falls within the range of 100° C. (inclusive) to 400° C. (inclusive) or the surface of the high refractive index material 100 has an illuminance that falls within the range of 10 mW/cm$^2$ (inclusive) to 1,000 mW/cm$^2$ (inclusive).

Figure 5:
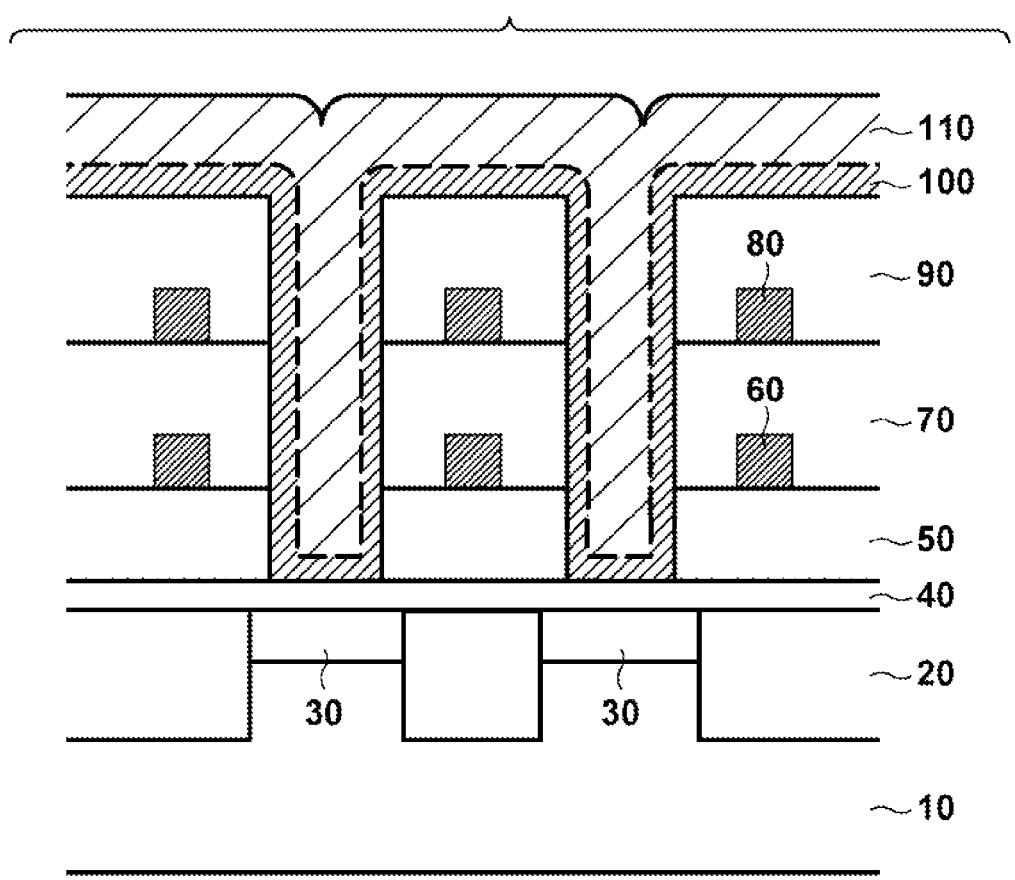
FIG. 5 is a sectional view for explaining a step in manufacturing a solid-state image sensor according to the embodiment of the present invention.

Similarly, a high refractive index material 110 is deposited in the openings 190 at a thickness of about 1 μm by the HDP-CVD method, and an anneal step is performed on the high refractive index material 110 by irradiating it with light or radiation. As a result, a state shown in a sectional view of FIG. 5 is obtained. Also, a high refractive index material 110 can further be deposited in the openings 190 at a thickness of about 1 μm to planarize the portion above the openings 190.

Note that when the light waveguide 200 has a concentric structure formed by one columnar part and a plurality of cylindrical parts which surround it, these processes can be performed a plurality of times.

Figure 6:
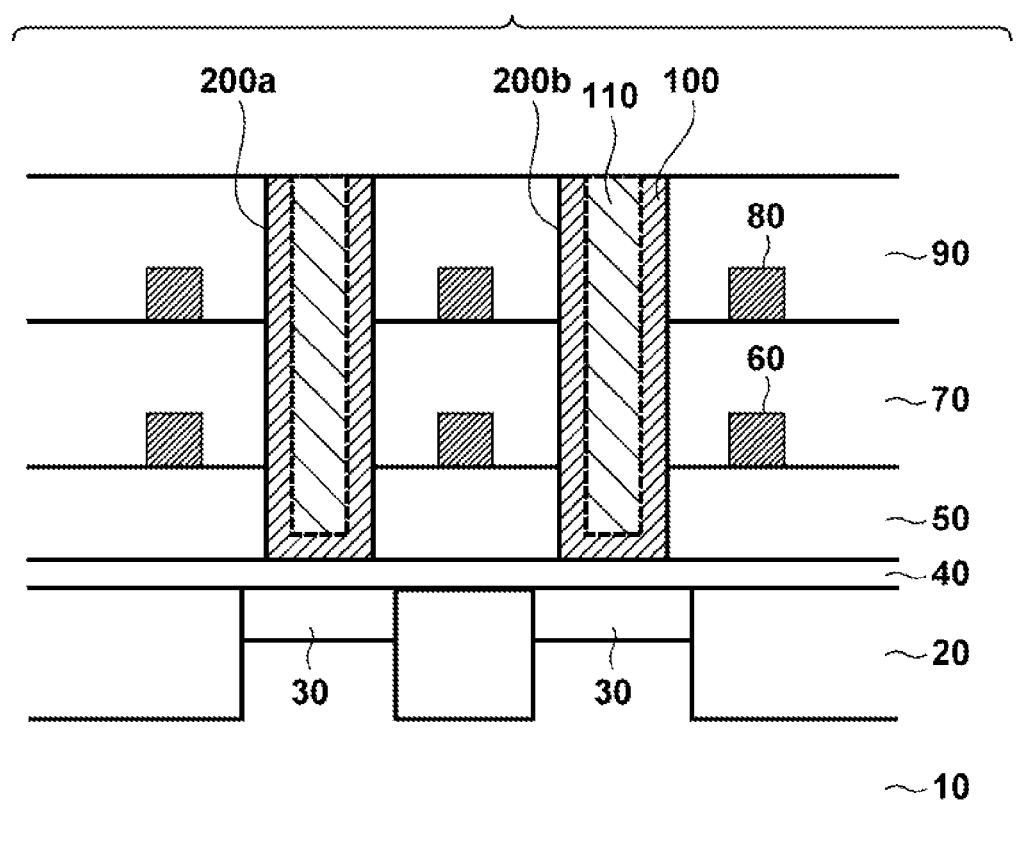
FIG. 6 is a sectional view for explaining a step in manufacturing a solid-state image sensor according to the embodiment of the present invention.
Figure 7:
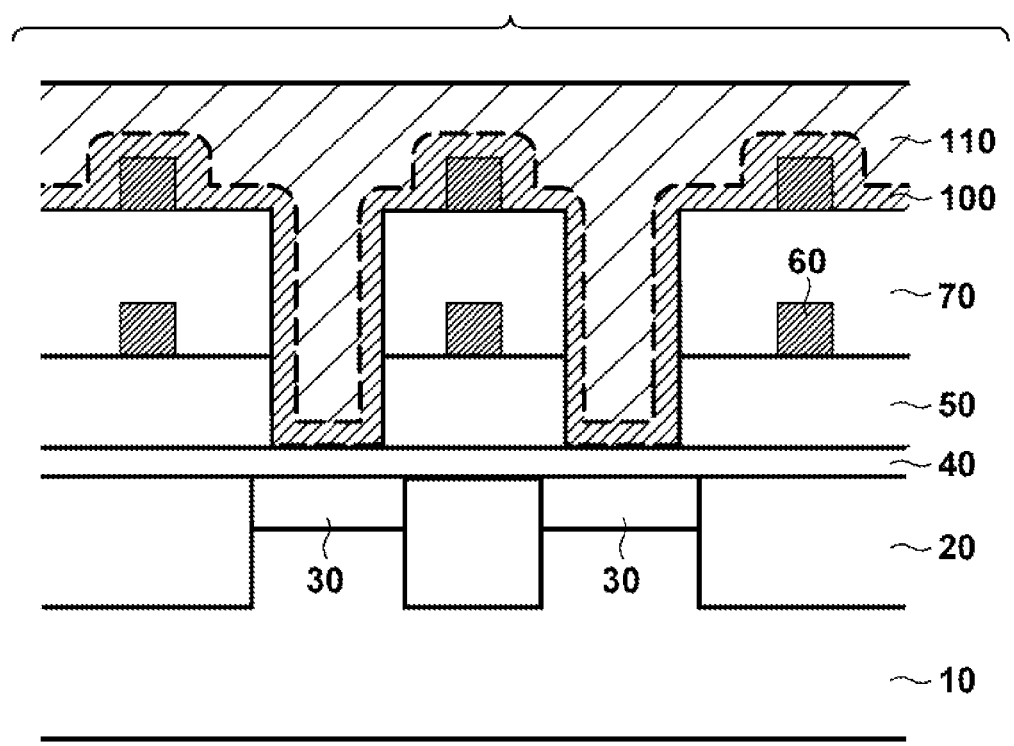
FIG. 7 is a sectional view for explaining a step in manufacturing a solid-state image sensor according to the embodiment of the present invention.

A planarizing process is performed on the high refractive index materials 100 and 110 up to the upper surface of the protective layer 90 by the CMP method to form light waveguides 200, so a state shown in a sectional view of FIG. 6 is obtained. Note that the etchback method which uses plasma etching can also be employed in place of the CMP method. This planarizing process makes it possible to reduce a manufacturing variation in subsequent steps and reflection by the interface between the planarized layer and the subsequent layer. Note that the above-mentioned step of forming a protective layer 90 can be omitted and this planarizing process can be performed up to a region defined by the high refractive index materials 100 and 110, so a state shown in a sectional view of FIG. 7 is obtained. In this case, the high refractive index materials 100 and 110 can be used as a protective layer in place of the protective layer 90. Also, the protective layer 90 shown in FIG. 1 may be formed as a third insulating film and a protective layer may further be formed on it.

Figure 8:
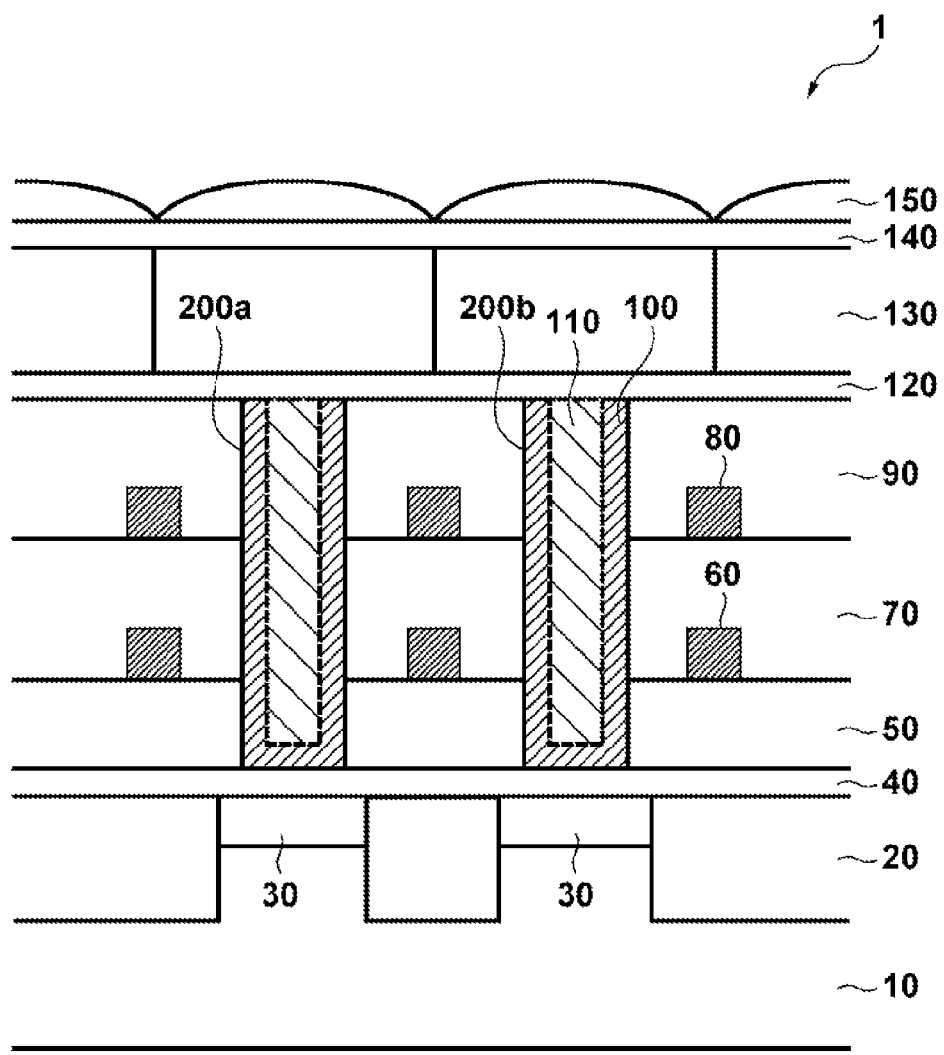
FIG. 8 is a sectional view for explaining a step in manufacturing a solid-state image sensor according to the embodiment of the present invention.

A first planarizing layer 120 is formed on the protective layer 90 and light waveguides 200 by coating. A color filter layer 130 including, for example, red, green, and blue layers is formed on the first planarizing layer 120 by coating, an exposure process, and a development process. A second planarizing layer 140 is formed on the color filter layer 130 by coating. Microlenses 150 are formed on the second planarizing layer 140 by coating, an exposure process, a development process, and a reflow process, so a state shown in a sectional view of FIG. 8 is obtained.

Figure 9A:
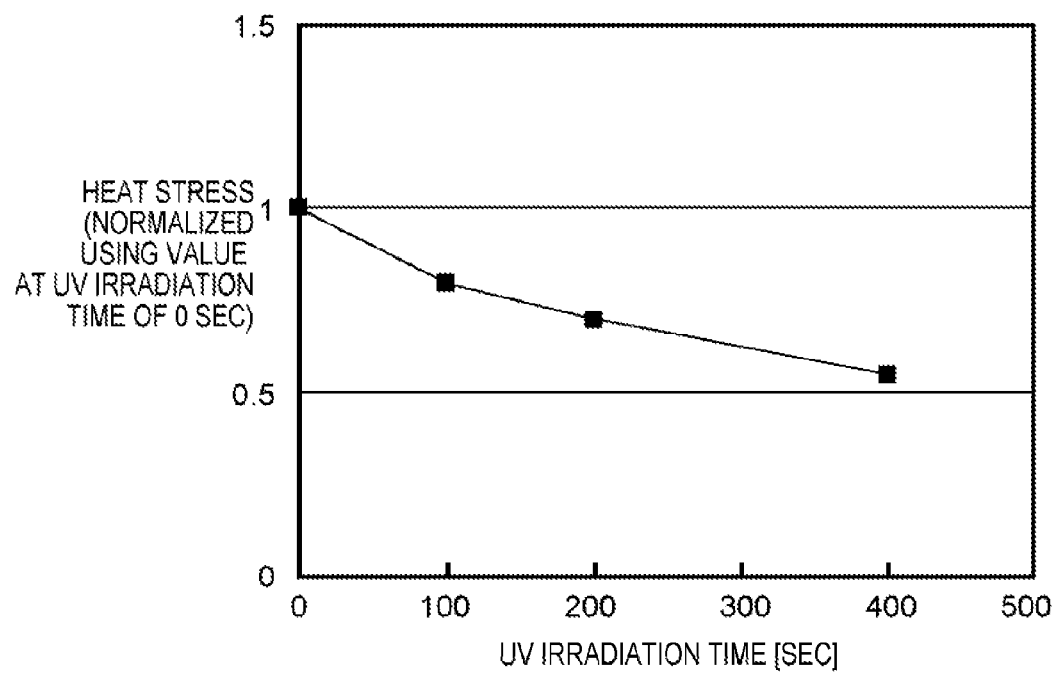
FIGS. 9A and 9B are plots of the measurement results showing the UV irradiation time dependences of the heat stress acting on silicon nitride and the warping amount of a silicon wafer due to the heat stress acting on the silicon nitride, respectively.
Figure 9B:
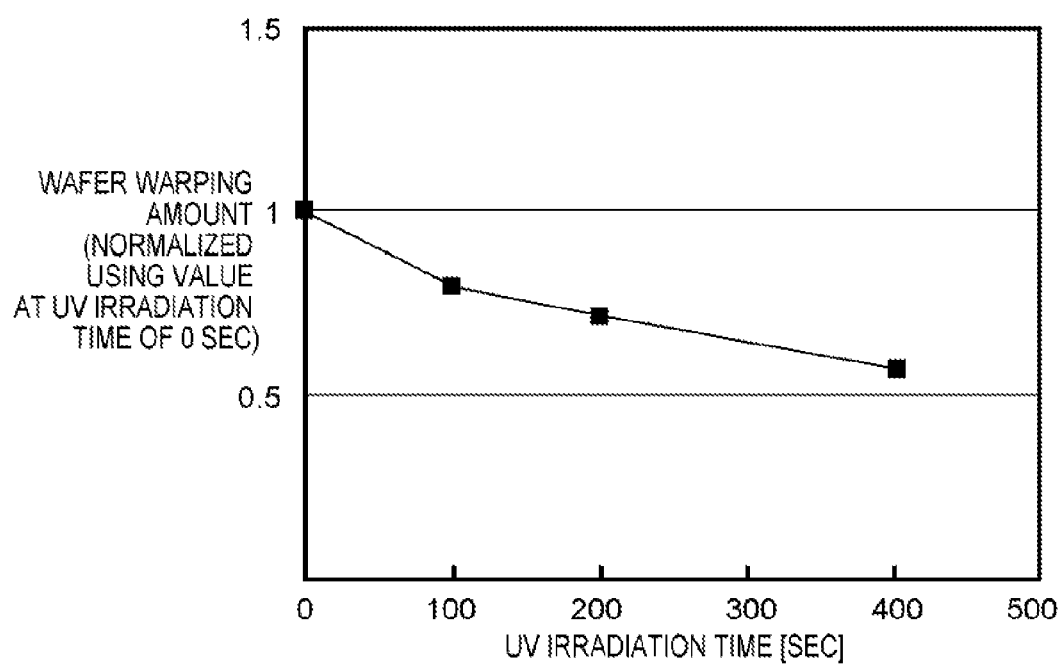

The anneal step performed in the step of forming the light waveguides 200 will be described below. More specifically, the effect of the anneal step by irradiating the high refractive index materials 100 and 110 with light or radiation will be described. The effect of the anneal step by irradiating silicon nitride as a high refractive index material with UV light will be taken as an example herein by showing measurement results. FIG. 9A is a plot of the measurement result showing the UV irradiation time dependence of the change in heat stress acting on silicon nitride, and FIG. 9B is a plot of the measurement result showing the UV irradiation time dependence of the change in warping amount of a silicon wafer due to the heat stress acting on the silicon nitride. The UV irradiation conditions include a wavelength of 450 nm or less, a temperature of 100° C. to 200° C., and an illuminance of 500 to 700 mW/cm$^2$. The plots of FIGS. 9A and 9B show the values of the heat stress and wafer warping amount immediately after silicon nitride deposition at a UV irradiation time of 0 sec, and the values of the heat stress and wafer warping amount are normalized using the values at the UV irradiation time of 0 sec. As can be seen from FIGS. 9A and 9B, the original heat stress acting on the silicon nitride is reduced by UV irradiation, and the warping of the silicon wafer, in turn, reduces. This is because Si—H and N—H bonds break and an Si—N bond is formed in the silicon nitride upon UV irradiation, thus changing the heat stress.

By increasing the UV illuminance, prolonging the UV irradiation time, raising the UV irradiation temperature, or combining these methods, the heat stress can be reduced to zero and eventually converted into tensile stress. Also, although both the high refractive index materials 100 and 110 are used in this embodiment, only the high refractive index material 100 may be used. Moreover, although the deposition and anneal steps are performed twice on the high refractive index materials 100 and 110, only a deposition step of the high refractive index material 100 may be performed after deposition and anneal steps of the high refractive index material 100. This means that at least one deposition step and one anneal step need only be performed.

As described above, according to this embodiment, it is possible to suppress warping of a silicon wafer. This, in turn, makes it possible to suppress a manufacturing variation, prevent the occurrence of a crack in an insulating film under a high refractive index material, and reduce a leakage current of a chip. Also, the method of manufacturing a solid-state image sensor is not limited to the above-mentioned embodiment, and various modifications and combinations can be made as needed, as a matter of course. For example, although silicon nitride has been taken as an example of the high refractive index material, other materials may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-133539, filed Jun. 15, 2011, which is hereby incorporated by reference herein in its entirety.

What is claimed is:

1. A method of manufacturing a solid-state image sensor, comprising:

preparing a semiconductor substrate including a photoelectric converter and an insulating film which includes an opening and is formed in a region above the photoelectric converter;

depositing a first material made of silicon nitride or silicon oxynitride and having a refractive index higher than the insulating film in the opening such that the material is in contact with the insulating film;

irradiating a surface of the first material deposited in the opening with ultraviolet light or an electron beam so as to reduce a heat stress of the first material;

depositing a second material made of silicon nitride or silicon oxynitride and having a refractive index higher than the insulating film on the surface of the first material that was irradiated and in the opening; and irradiating a surface of the second material that was deposited with ultraviolet light or an electron beam so as to reduce a heat stress of the second material, wherein a light waveguide which is configured to guide an incident light to the photoelectric converter is formed through the depositing of the first material, the irradiating, and the depositing of the second material.

2. The method according to claim 1, wherein the light waveguide is formed by performing the depositing and the irradiating pluralities of times.

3. The method according to claim 1, wherein the irradiating of the surface of the first material is performed so that the first material has a temperature that falls within a range of 100° C. (inclusive) to 400° C. (inclusive).

4. The method according to claim 1, wherein the irradiating of the surface of the first material is performed so that a surface of the first material has an illuminance that falls within a range of 10 mW/cm$^2$ (inclusive) to 1,000 mW/cm$^2$ (inclusive).

5. The method according to claim 1, wherein the first material contains silicon nitride.

6. A method of manufacturing a solid-state image sensor, comprising:

forming, on a semiconductor substrate including a photoelectric converter, an insulating film which contains silicon oxide and includes an opening in a region above the photoelectric converter;

depositing a first material made of silicon nitride or silicon oxynitride in the opening such that the first material is in contact with the insulating film;

irradiating a surface of the first material deposited in the opening with ultraviolet light or an electron beam so as to reduce a heat stress of the first material;

depositing a second material made of silicon nitride or silicon oxynitride on the surface of the first material that was irradiated and in the opening; and irradiating a surface of the second material that was deposited with ultraviolet light or an electron beam so as to reduce a heat stress of the second material.

7. The method according to claim 1, wherein the light waveguide is configured to guide the incident light to the photoelectric converter by reflecting the incident light at an interface between the insulating film and the first material.

8. A method of manufacturing a solid-state image sensor, comprising:

preparing a semiconductor substrate including a photoelectric converter and an insulating film which contains silicon oxide and includes an opening in a region above the photoelectric converter;

depositing a first material made of silicon nitride or silicon oxynitride in the opening;

irradiating a surface of the first material deposited in the opening with ultraviolet light or an electron beam so as to reduce a heat stress of the first material;

depositing a second material made of silicon nitride or silicon oxynitride on the surface of the first material that was irradiated and in the opening; and irradiating a surface of the second material that was deposited with ultraviolet light or an electron beam so as to reduce a heat stress of the second material, wherein a light waveguide which is configured to guide an incident light to the photoelectric converter is formed through the depositing of the first material, the irradiating, and the depositing of the second material.

* * * * *